(12) United States Patent
Wang et al.

(10) Patent No.: US 8,282,842 B2
(45) Date of Patent: Oct. 9, 2012

(54) CLEANING METHOD FOLLOWING OPENING ETCH

(75) Inventors: Chieh-Ju Wang, Tainan (TW);
Jyh-Cherng Yau, Tai-Nan (TW);
Yu-Tsung Lai, Tai-Chung Hsien (TW);
Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 877 days.

(21) Appl. No.: 11/946,875

(22) Filed: Nov. 29, 2007

(65) Prior Publication Data

US 2009/0142931 A1    Jun. 4, 2009

(51) Int. Cl.
*H01B 13/00* (2006.01)

(52) U.S. Cl. .............. 216/17; 216/37; 216/67; 438/624; 438/637; 438/675; 438/740; 438/706

(58) Field of Classification Search .................. 216/17, 216/37, 67; 438/624, 637, 675, 740, 706, 438/638, 710, 725, 786
See application file for complete search history.

(56) References Cited

U.S. PATENT DOCUMENTS

| | | | |
|---|---|---|---|
| 6,114,259 A | 9/2000 | Sukharev | |
| 6,204,192 B1 | 3/2001 | Zhao | |
| 6,399,503 B1 * | 6/2002 | Wu et al. | 438/692 |
| 6,534,921 B1 * | 3/2003 | Seo et al. | 315/111.51 |
| 6,713,402 B2 * | 3/2004 | Smith et al. | 438/710 |
| 2003/0224595 A1 | 12/2003 | Smith | |
| 2006/0148243 A1 * | 7/2006 | Wang | 438/638 |
| 2006/0246717 A1 * | 11/2006 | Wang | 438/637 |
| 2007/0026666 A1 * | 2/2007 | Won | 438/624 |
| 2007/0077751 A1 | 4/2007 | Chen | |

FOREIGN PATENT DOCUMENTS

| | | |
|---|---|---|
| TW | 200623259 | 7/2006 |
| TW | 200737339 | 10/2007 |

OTHER PUBLICATIONS

L. Broussous et al. Microelectronic Engg. 84, (2007), pp. 2600-2605.*
A. Matsushita et al., "Low Damage Ashing using H2/He Plasma for Porous Ultra Low-k", 2003, p. 147~149, IEEE.
J.S. Tsai et al., "Effect of Ash Process on Leakage Mechanism of Cu/ELK (k=2.5) Interconnect for 65/45nm Generation", 2005, p. 94~96, IEEE.

* cited by examiner

*Primary Examiner* — Lan Vinh
*Assistant Examiner* — Maki Angadi
(74) *Attorney, Agent, or Firm* — Winston Hsu; Scott Margo

(57) ABSTRACT

A cleaning method following an opening etching is provided. First, a semiconductor substrate having a dielectric layer is provided. The hard mask layer includes at least a metal layer. The opening etch is then carried out to form at least an opening in the dielectric layer. A nitrogen (N2) treatment process is performed to clean polymer residues having carbon-fluorine (C—F) bonds remained in the opening. Finally, a wet cleaning process is performed.

16 Claims, 11 Drawing Sheets

CLEANING METHOD FOLLOWING OPENING ETCH

BACKGROUND OF THE INVENTION

1. Field of the Invention

The present invention provides a cleaning method following an opening etch, and more particularly, to a cleaning method that utilizes an in-situ nitrogen (N2) treatment process.

2. Description of the Prior Art

To meet the needs of high integration and high processing speed in integrated circuits (ICs) and in semiconductor fabrication of 0.13 micrometer ($\mu$m) or below, a copper (Cu) dual damascene technology in company with low dielectric constants (k values) (low-k; k$\leq$2.9) dielectric layer has now become an effective metal interconnection solution. The reason is because Cu has the features of lower resistance (approximately 30% lower than aluminum) and better electromigration resistance and so on. Besides, the use of low-k materials as dielectric layers can help to reduce Resistance-Capacitance Time Delay. Therefore, low-k dielectric layer in company with Cu dual damascene in ICs fabrication has become more and more significant.

Low-k dielectric layer is made of carbon doped silicon oxide materials among which at least a portion of the oxygen atoms bonded to the silicon atoms are replaced by one or more organic functional groups such as, for example, an alky group ($CH_3$—), etc. The low-k materials comprise organo-silicate-glasses (OSGs), fluorinated silica glasses (FSGs), hydrogen silsequoxiane (HSQ), methyl silsequoxiane (MSQ), etc. The dielectric constants of those materials are all smaller than about 2.5.

The substitution of one or more organic functional groups for some of the oxygen atoms bonded to the silicon atoms in silicon oxide dielectric materials has a beneficial effect in lowering of the dielectric constant of the carbon doped silicon oxide materials. However, it has been found that the bond formed between the silicon atoms and the organic groups is not as stable as the silicon-oxygen bond formed in conventional silicon oxide materials. Therefore, the bond formed between the silicon atoms and the organic groups is easily damaged during some processes of the Cu dual damascene fabrication such as an opening etch, which is performed to etch the low-k dielectric layer to form opening structures (i.e. trench or via hole), or an ashing process used for removing photoresist layers, etc.

Radicals, which are formed while the bonds formed between the silicon atoms and the organic groups are cleaved, will react with reactive gases used in etch or ashing processes to produce lots of polymers having carbon-fluorine (C—F) bonds remaining on the bottom or the sidewall of the dual damascene structure. Besides, as the improvement of the semiconductor fabrication technology, hard mask layers containing metal layers such as titanium nitride (TiN), etc, are used as etching mask to replace the conventional photoresist layer in the Cu dual damascene fabrication. However, the use of the hard mask layer containing metal layers as an etching mask results in metal residues, which are more difficult to remove than conventional organic photoresist layers, remaining on the bottom or the sidewall of the dual damascene structure. Accordingly, if the dual damascene structure having those polymers or residues were directly filled with a metal conductive layer such as a Cu layer to form a metal interconnection, the resistance would increase.

Accordingly, there are plenty of patents that have disclosed how to clean polymers having carbon-fluorine bonds or metal residues. In U.S patent publication No. 2006/0246717 A1, entitled "Method for fabricating a dual damascene and polymer removal", a dry clean process is disclosed in which a cleaning gas with hydrogen ($H_2$), oxygen ($O_2$), or carbon tetrafluoride ($CF_4$) is introduced into a reaction chamber, where the etching process has been performed to form the dual damascene structure, to remove the residues resulting form etching the low-k dielectric layer.

In addition, in U.S. Pat. No. 6,713,406, entitled "Method for polymer removal following etch-stop layer etch", an extra process is disclosed in which the semiconductor substrate is moved to a plasma cleaning chamber for introducing a hydrogen-containing plasma to remove the residue polymers.

However, the aforesaid cleaning methods of using $H_2/O_2/CF_4$ plasma or only $H_2$-containing plasma still can't remove polymers or metal residues effectively; therefore, the aim of increasing yield hasn't made a breakthrough. Accordingly, after performing the conventional plasma cleaning methods, many times wet cleaning processes are needed to achieve removing polymers or metal residues clean. As increasing in the times of wet cleaning processes, the throughput is decreased and the cost is increased. Furthermore, the cleaning methods using reactive gases such as $H_2$ or $CH_4$, etc, as plasma sources usually result in damaging the low-k dielectric layer or changing the dielectric constant of the low-k dielectric layer so as to affect the capacitances of the corresponding devices.

Accordingly, how to remove the residues resulting from the opening etch with a more effective method without destroying the dual damascene structures or changing the constant value of the low-k dielectric layer is still an important issue that needs to be investigated.

SUMMARY OF THE INVENTION

The present invention relates to a cleaning method following an opening etch, and more particularly, to a cleaning method utilizing an in-situ nitrogen ($N_2$) treatment process.

According to the claims, the present invention provides a cleaning method following an opening etch. First, a semiconductor substrate having a dielectric layer is provided. The opening etch is subsequently carried out to form at least an opening in the dielectric layer. Then, a nitrogen treatment process is performed to clean polymer residues having carbon-fluorine bonds remained in the opening. Finally, a wet cleaning process is performed.

The present invention utilizes only an in-situ nitrogen treatment process and a wet cleaning process to achieve a high cleaning efficiency in removing the residues result from an opening etch of an interconnection fabrication; therefore, the fabrication processes can be simplified greatly so as to increase the throughput and to lower the fabrication cost. In addition, the yield can be improved substantially along with the increase of the cleaning capacity. Furthermore, because the present invention only utilizes nitrogen as a plasma source instead of using reactive gas such as hydrogen ($H_2$), oxygen ($O_2$), or carbon tetrafluoride (CF4), etc, as a plasma source; therefore, the problems relating to damaging low-k dielectric layers and changing the k value of the low-k dielectric layers in the prior art can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
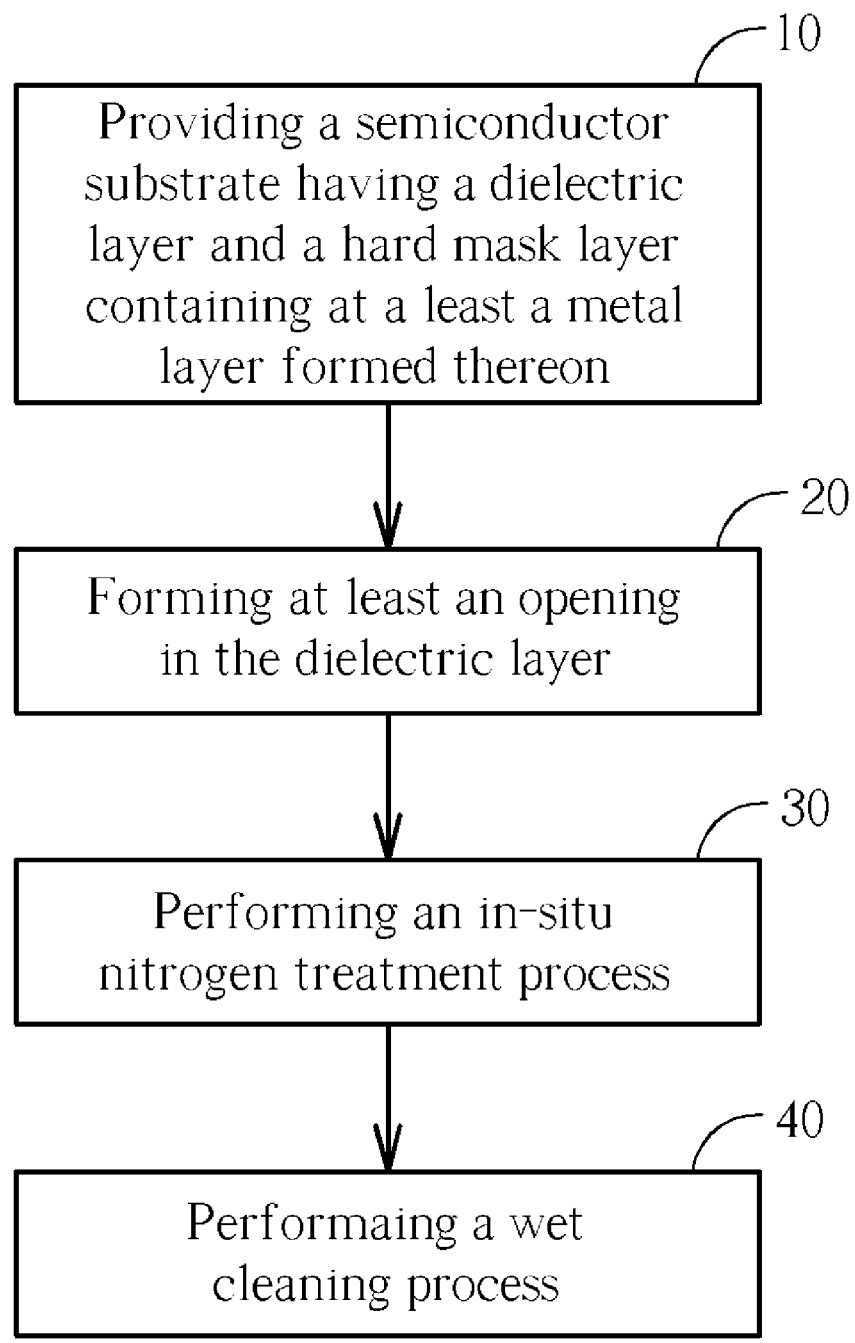
FIG. 1 is a flow chart of a cleaning method according to the present invention.

Please refer to FIG. 1, which is a flow chart of a cleaning method following an opening etch according to the present invention. As shown in FIG. 1, in step 10, at first, a semiconductor substrate such as a silicon substrate or a silicon-on-insulator (SOI) substrate, etc, is provided. A dielectric layer and a hard mask layer are formed on the semiconductor substrate. The hard mask layer comprises at least a metal layer. The semiconductor substrate may further comprise at least a functional device such as a Metal Oxide Semiconductor (MOS) transistor, etc thereon. The dielectric layer is a low-k dielectric layer such as a carbon-doped oxide (CDO) layer, an organo-silicate-glasses (OSGs) layer, a fluorinated silica glasses (FSGs) layer, or an ultra low-k (k<2.5) material layer, etc. The method of forming the low-k dielectric layer comprises a spin-coating process, a plasma-enhanced chemical vapor deposition (PECVD) process, or a high-density plasma chemical vapor deposition (HDPCVD) process, etc.

In step 20, at least an opening etch using the hard mask layer, which comprises at least a metal layer, as an etching mask is carried out to form at least an opening in the dielectric layer. The opening etch may be a sputtering etch process, a plasma etch process or a reactive ion etching (RIE) process, etc, which introduces reactive gases into an etch reaction chamber to etch the hard mask layer and the dielectric layer so as to form at least an opening in the dielectric layer. The etch reaction chamber may be an Induced Coupled Plasma (ICP) chamber, an Electron Cyclotron Resonance (ECR) chamber, or a Transformer Coupled Plasma (TCP) chamber, etc. The sort of gases being introduced into the reaction chamber varies according to what kinds of materials need to be etched. For example, if etching the dielectric layer is desired, a reactive gas containing carbon atoms and fluorine atoms such as carbon tetrafluoride ($CF_4$), trifluoromenthane ($CHF_3$), perfluoroethane ($C_2F_6$), or sulfur hexafluoride ($C_4F_8$), etc, will be introduced into the reaction chamber and selectively in combination with oxygen and hydrogen to form reactive gas plasma. The dielectric layer is then etched by the mechanism of ion bombardment, plasma etch, or both of the ion bombardment and the plasma etch.

During the aforesaid opening etch, since the dielectric layer is made of a low-k dielectric material, polymers having carbon-fluorine bonds are formed remaining on the bottom or the sidewall of the opening. On the other hand, hardly-removed metal residues, such as metal residues having carbon-carbon bonds (C—C) may also be produced while etching the hard mask layer containing the metal layer. The polymers having carbon-fluorine bonds and the metal residues are generally called residues herein. The opening formed in step 20 may be any opening pattern such as a single damascene opening, a dual damascene opening, or a plug hole, etc. The dual damascene opening may be a trench-first dual damascene opening or a via-first dual damascene opening. In addition, the plug hole may be a contact hole or a via hole.

In step 30, an in-situ nitrogen treatment process is performed to remove the residues formed during the opening etch. It should be noticed that the in-situ nitrogen treatment process is carried out in the same reaction chamber where the opening etch is carried out. The cleaning mechanism is the same as those used in the opening etch such as ion bombardment, plasma etch, or both, so as to remove the residues remaining in the opening.

According to the preferred embodiment of the present invention, as the opening etch is finished, the nitrogen treatment is carried out to introduce only nitrogen of a gas flow of about 700 to 1300 standard cubic centimeter per minute (sccm) into the reaction chamber. The pressure of the reaction chamber is set as about 150 to 250 mtorr. The power is set as 200 watt (W) generated by a 27 MHz radio frequency generator. The reaction time is about 30 seconds. The nitrogen being introduced into the reaction chamber provides a nitrogen plasma, which comprises nitrogen radicals, nitrogen ions, or nitrogen atoms, to replace a portion of the fluorine atoms in the polymers having carbon-fluorine bonds so as to form volatile products having carbon-nitrogen (C—N) bonds. Thereafter, the products having carbon-nitrogen bonds can be exhausted out of the reaction chamber by exhaust systems connected to the reaction chamber. In addition, the nitrogen plasma may also react with the metal residues to form products that are easily removed. For example, the nitrogen radicals can cleave a portion of the carbon-carbon bonds in the metal residues, which have the carbon-carbon bonds, so as to form products of smaller molecular weights, such as $H_xC_yN_z$ compounds. Therefore, those products of smaller molecular weights can be exhausted out of the reaction chamber by exhaust systems connected to the reaction chamber. Furthermore, those products are also easily removed by the following wet cleaning process.

In step 40, a wet cleaning process is performed. According to the preferred embodiment of the present invention, the wet cleaning process is carried out to move the semiconductor substrate having the opening into a wet cleaning apparatus and then to dip the semiconductor substrate in a diluted hydrofluoric acid of a concentration of about 2.5 parts per million (ppm) for about 1 to 5 minutes. Afterwards the semiconductor substrate is passed through the processes such as rising by de-ionized water, or drying, etc, and is finally removed out of the wet cleaning apparatus. This process is well known by those skilled in the art, and the details of which are not further explained herein for the sake of brevity.

It should be noticed that the naming of the nitrogen treatment process as shown in aforesaid step 30 comes from using nitrogen gas as the plasma source in the present invention. Because the present invention only utilizes non-reactive gas (i.e. nitrogen gas) as a plasma source instead of using reactive gas such as hydrogen ($H_2$), oxygen ($O_2$), or carbon tetrafluoride (CF4), etc, as a plasma source; therefore, the problems relating to damaging low-k dielectric layers and changing the k value of the low-k dielectric layers in the prior art can be avoided. However, the cleaning gas used in step 30 is not limited to nitrogen gas, other non-reactive gases such as noble gases i.e., helium, or neon, etc may also be used.

Figure 2:
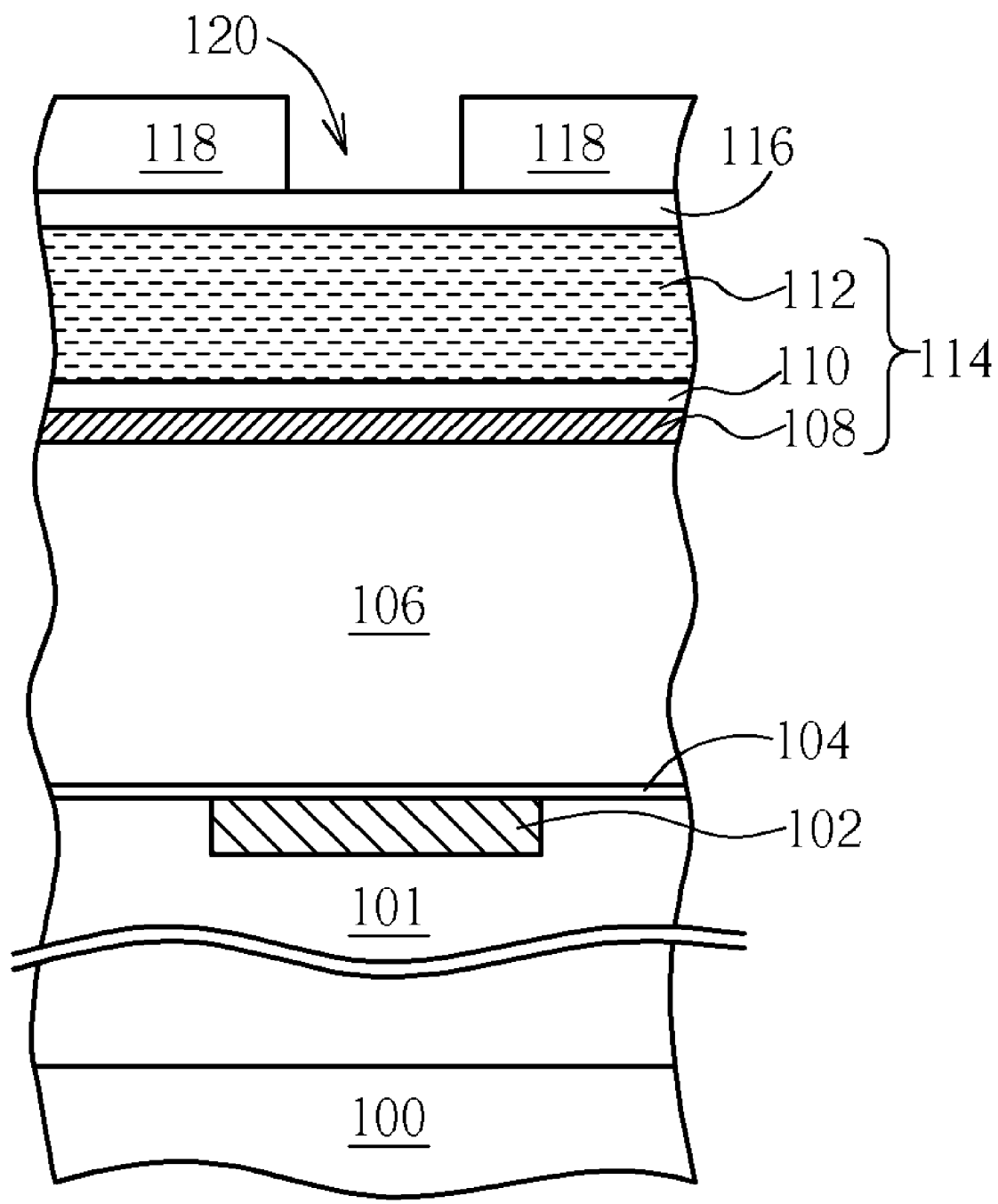
FIG. 2 to FIG. 7 illustrate a first preferred embodiment of the present invention according to the cleaning method as shown in FIG. 1.

Please refer to FIG. 2 to FIG. 7, which illustrate a first preferred embodiment according to the cleaning method as shown in FIG. 1. The cleaning method as shown in FIG. 2 to FIG. 7 is applied in a dual damascene opening fabrication. In which the dual damascene may be a trench-first dual damascene opening or a via-first dual damascene. Hereinafter, a cleaning method applied in a trench-first dual damascene opening fabrication will be illustrated as an example. As shown in FIG. 2, first, a semiconductor substrate 100 is provided such as a silicon substrate or a silicon-on-insulator (SOI) substrate, etc. The semiconductor substrate 100 has a conductive layer 102 thereon and is positioned in a bottom dielectric layer 101. Then, a bottom layer 104, a dielectric layer 106, an etch-stop layer 108, a metal layer 110, a mask layer 112, and a first bottom anti-reflection coating (BARC) layer 116 are formed in order on the bottom dielectric layer 101 and the conductive layer 102. Then, a patterned first photoresist layer 118 is formed on the first BARC layer 116 to define a trench pattern 120.

The etch-stop layer 108, the metal layer 110, and the mask layer 112 form a composite layer serving as a hard mask layer 114 during the following etching processes. The etch-stop layer 108 is preferably a silicon carbide (SiC) layer; the metal layer 110 is preferably a titanium nitride (TiN) or a tantalum nitride (TaN) layer; the mask layer 112 is selectively formed with a plasma enhanced oxide (PEOX) layer. In addition, the bottom layer 104 is a silicon nitride layer, and the dielectric layer 106 is made of a low-k dielectric material such as FSG, OSG, or ULK materials (k<2.5).

Figure 3:
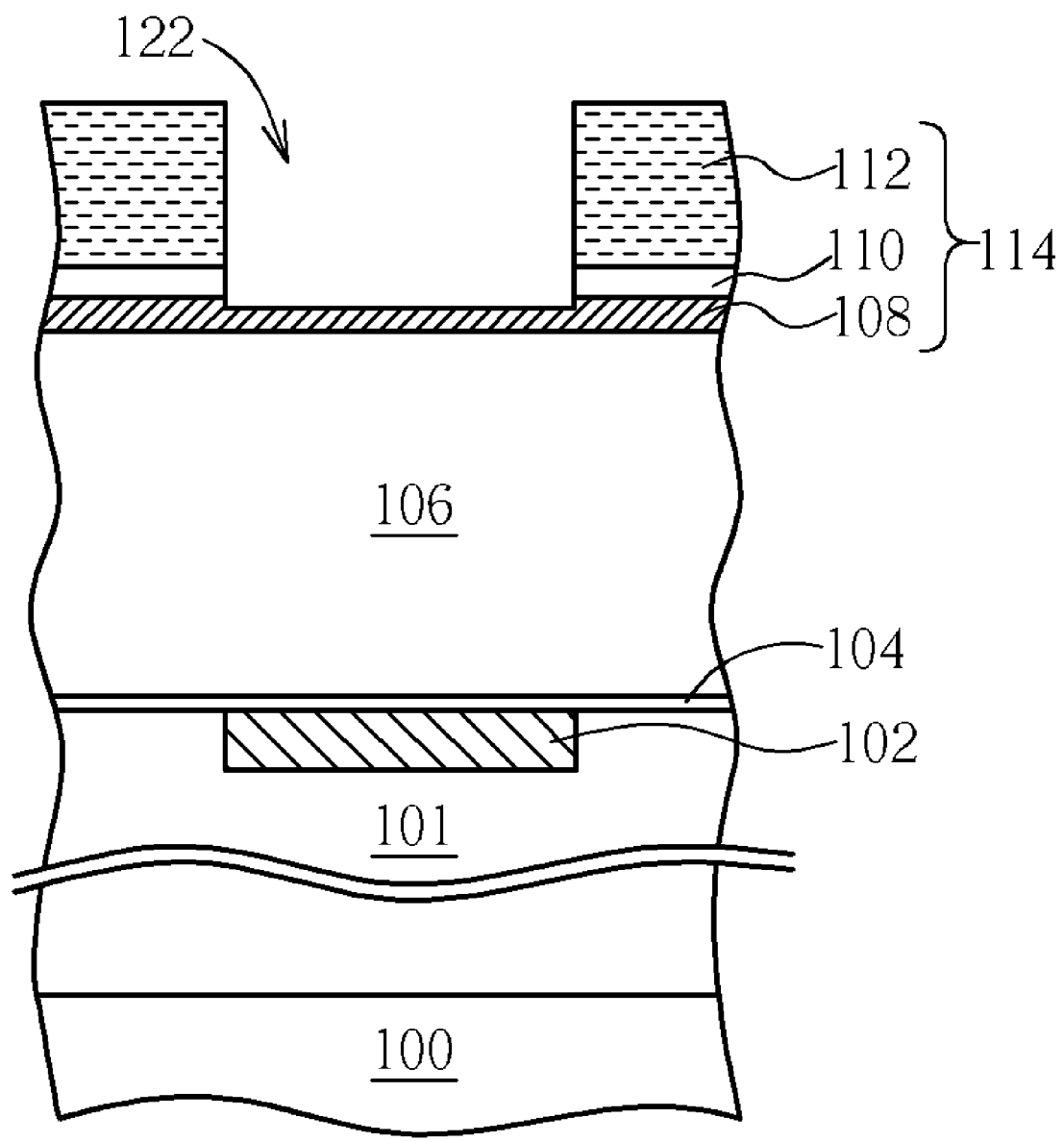

A first etching process, such as a sputtering etch process, a plasma etch process, or a reactive ion etching (RIE) process, is carried out to etch the first BARC layer 116, the mask layer 112, the metal layer 110 and a portion of the etch-stop layer 108 through the trench pattern 120 within the first photoresist layer 118 so as to form a trench recess 122 in the hard mask layer 114. The first etching process is stopped at the etch-stop layer 108. Then, the first photoresist layer 118 and the first BARC 116 are removed, as shown in FIG. 3.

Figure 4:
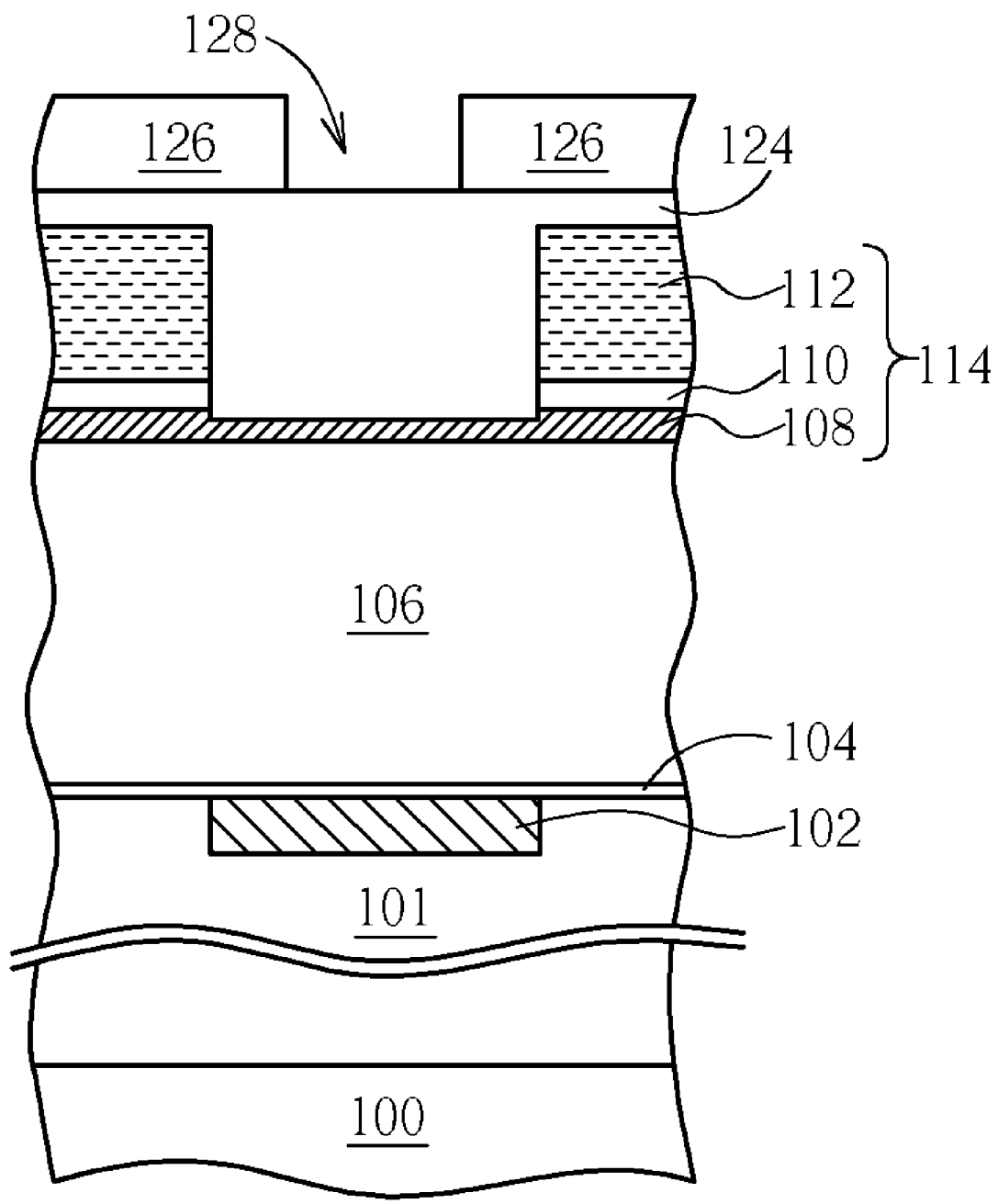

As shown in FIG. 4, a second BARC layer 124 is formed on the hard mask layer 114. The trench recess 122 is filled with the second BARC layer 124. A patterned second photoresist layer 126 is then formed on the second BARC layer 124 to define a via pattern 128.

Figure 5:
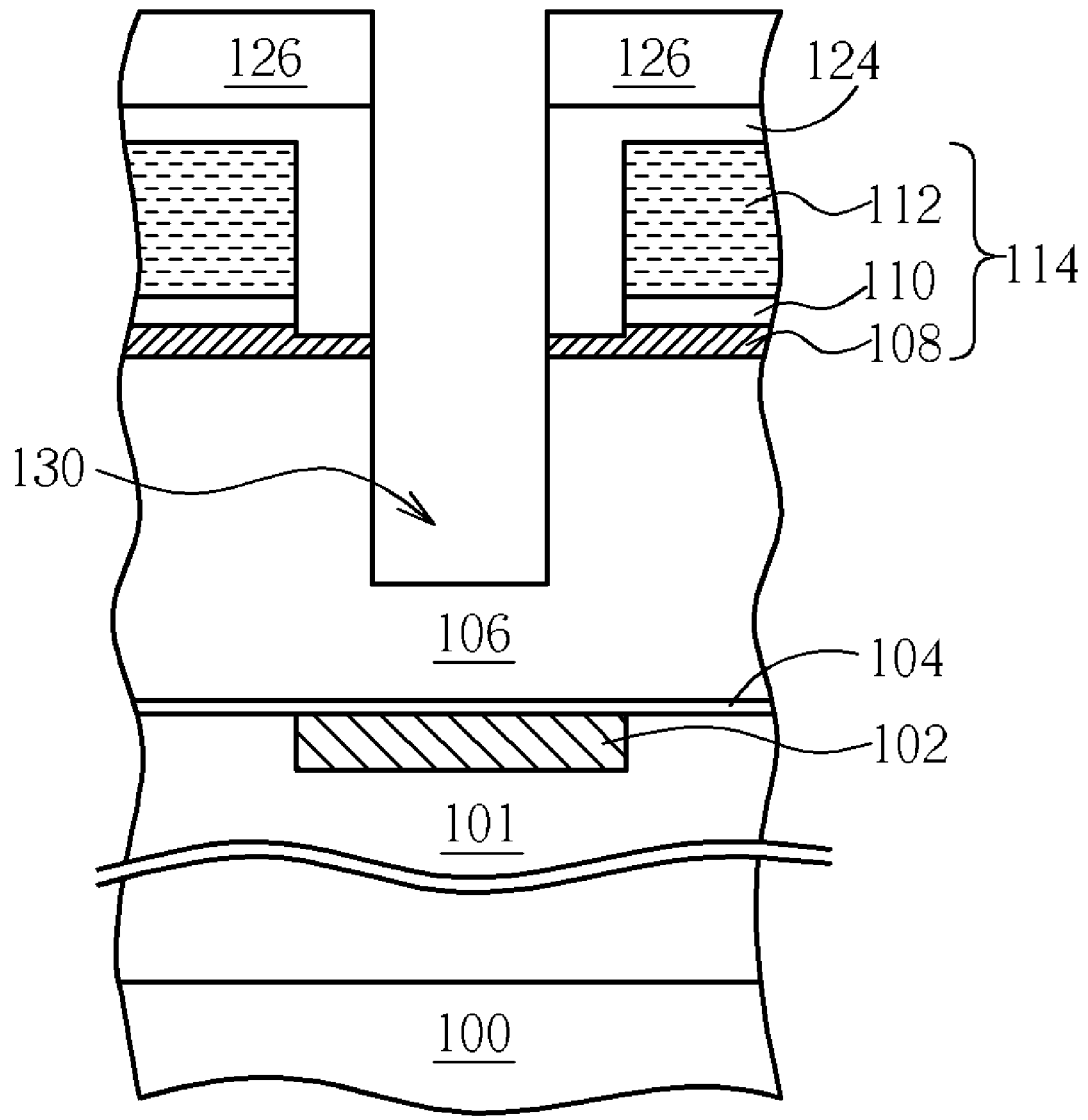

As shown in FIG. 5, a second etching process, such as a sputtering etch process, a plasma etch process, or a reactive ion etching (RIE) process, is carried out to etch the second BARC layer 124, the etch-stop layer 108, and a portion of the dielectric layer 106 through the via pattern 128 within the second photoresist layer 126 so as to form a via recess 130. Then, the second photoresist layer 126 and the second BARC layer are removed.

Figure 6:
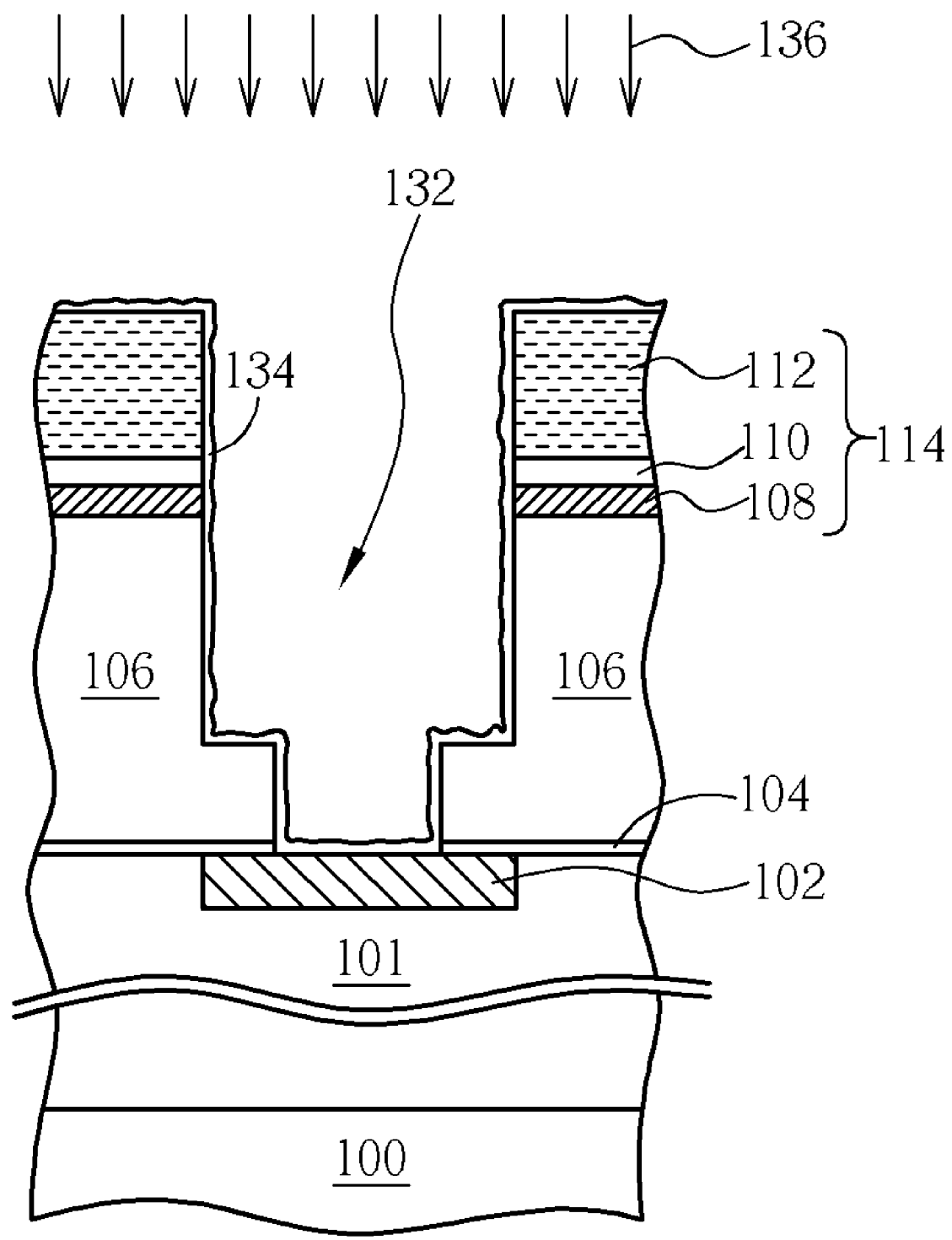

As shown in FIG. 6, a third etching process using the hard mask layer as an etching mask, such as a sputtering etch process, a plasma etch process, or a reactive ion etching (RIE) process, is carried out to etch the dielectric layer 106 and the bottom layer 104 through the via recess 130 and the trench recess 122 until the conductive layer 102 is exposed. Therefore, a dual damascene opening 132 having a trench and a via hole is formed in the dielectric layer 106.

Since the dielectric layer 106 is formed with a low-k material, those etching processes produce polymers having carbon-fluorine bonds remaining in the dual damascene opening 132. On the other hand, hardly-removed metal residues, such as the polymers with carbon-carbon (C—C) bonds, may also be produced remaining in the dual damascene opening 132 while etching the hard mask layer 114 containing the metal layer 112. The polymers having carbon-fluorine bonds and the metal residues are generally called residues 134 herein. According, an in-situ nitrogen treatment process 136 is performed after the third etching process is finished.

According to the preferred embodiment of the present invention, as the opening etch is finished, the nitrogen treatment process 136 is carried out to introduce only nitrogen of a gas flow of about 700 to 1300 standard cubic centimeter per minute (sccm) into the reaction chamber. The pressure of the reaction chamber is set as 150 to 250 mtorr. The power is set as 200 watt (W) generated by a 27 MHz radio frequency generator. The reaction time is about 30 seconds. The nitrogen being introduced into the reaction chamber provides a nitrogen plasma, which comprises nitrogen radicals, nitrogen ions, or nitrogen atoms, to replace a portion of the fluorine atoms in the polymers having carbon-fluorine bonds so as to form volatile products with carbon-nitrogen (C—N) bonds. Thereafter, the products with carbon-nitrogen bonds can be exhausted out of the reaction chamber by exhaust systems connected to the reaction chamber. In addition, the nitrogen plasma may react with the metal residues to form products that are easily removed. For example, the nitrogen radicals can cleave a portion of the carbon-carbon bonds in the metal residues, which have the carbon-carbon bonds, so as to form products of smaller molecular weights, such as HxCyNz compounds. Therefore, those products of smaller molecular weights can be exhausted out of the reaction chamber by exhaust systems connected to the reaction chamber. Furthermore, those products are also easily removed by the following wet cleaning process.

Figure 7:
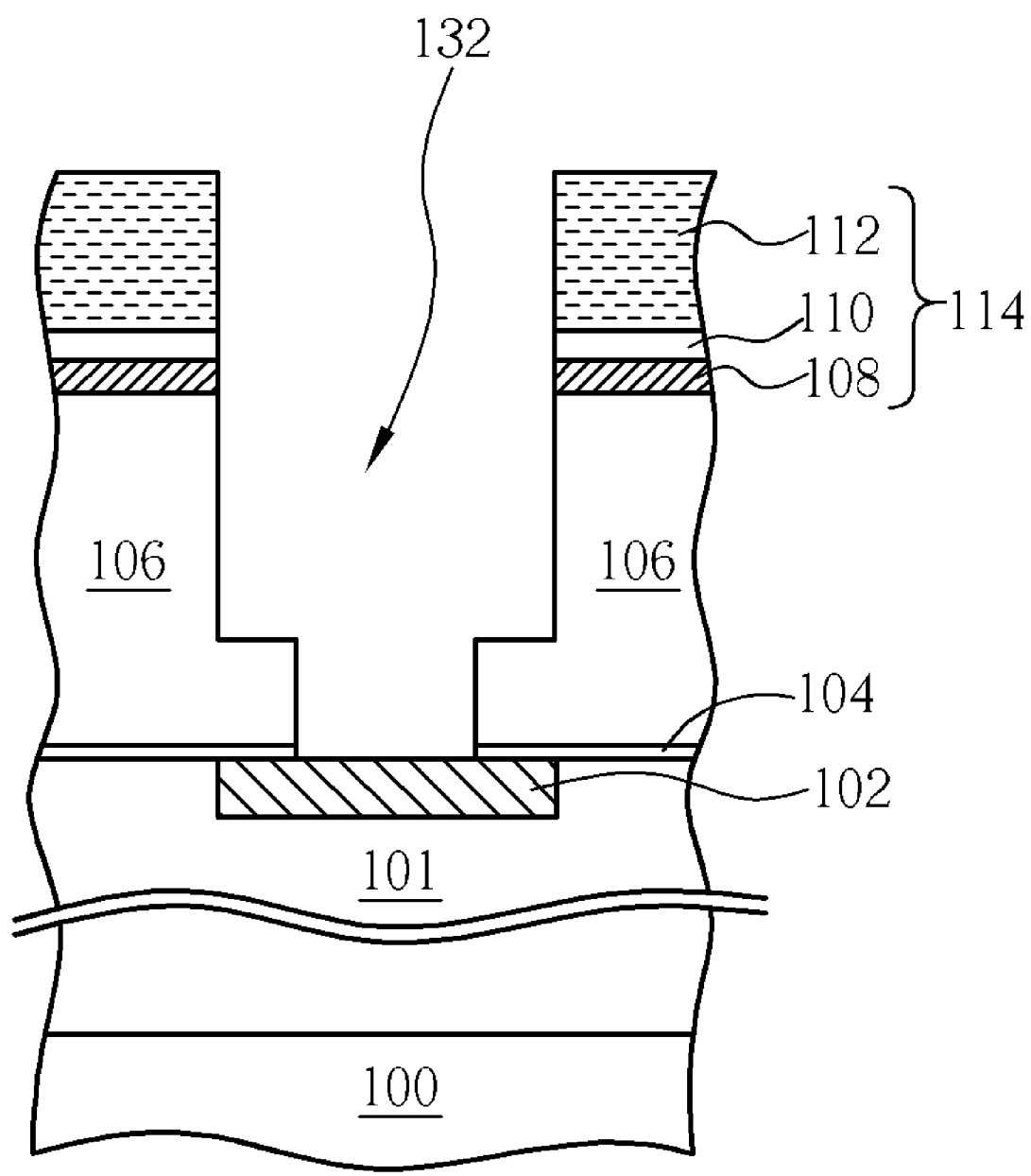

Subsequently, the semiconductor substrate 100 having the dual damascene opening 132 is moved out from the reaction chamber where the etching processes and the nitrogen treatment process 136 are performed. The semiconductor substrate 100 is then moved into a wet cleaning apparatus ready for performing a wet cleaning process. According to the preferred embodiment of the present invention, the wet cleaning process is carried out to dip the semiconductor substrate 100 having the dual damascene opening 132 in a diluted hydrofluoric acid of a concentration of about 2.5 ppm for about 1 to 5 minutes. Finally, as shown in FIG. 7, a clean dual damascene opening 132 is obtained. Afterward, deposition processes and polishing processes and so on are performed to from a Cu dual damascene in the dual damascene opening 132. This process is well known by those skilled in the art and the details of which are not further explained herein for the sake of brevity.

It should be notice that the cleaning method as shown in FIG. 2 to FIG. 7 is not limited to be applied to the trench-first dual damascene fabrication; it may also be applied to the via-first dual damascene fabrication. No matter which fabrication is applied, the in-situ nitrogen treatment process 136 and the wet cleaning process are performed after performing the opening etch.

Figure 8:
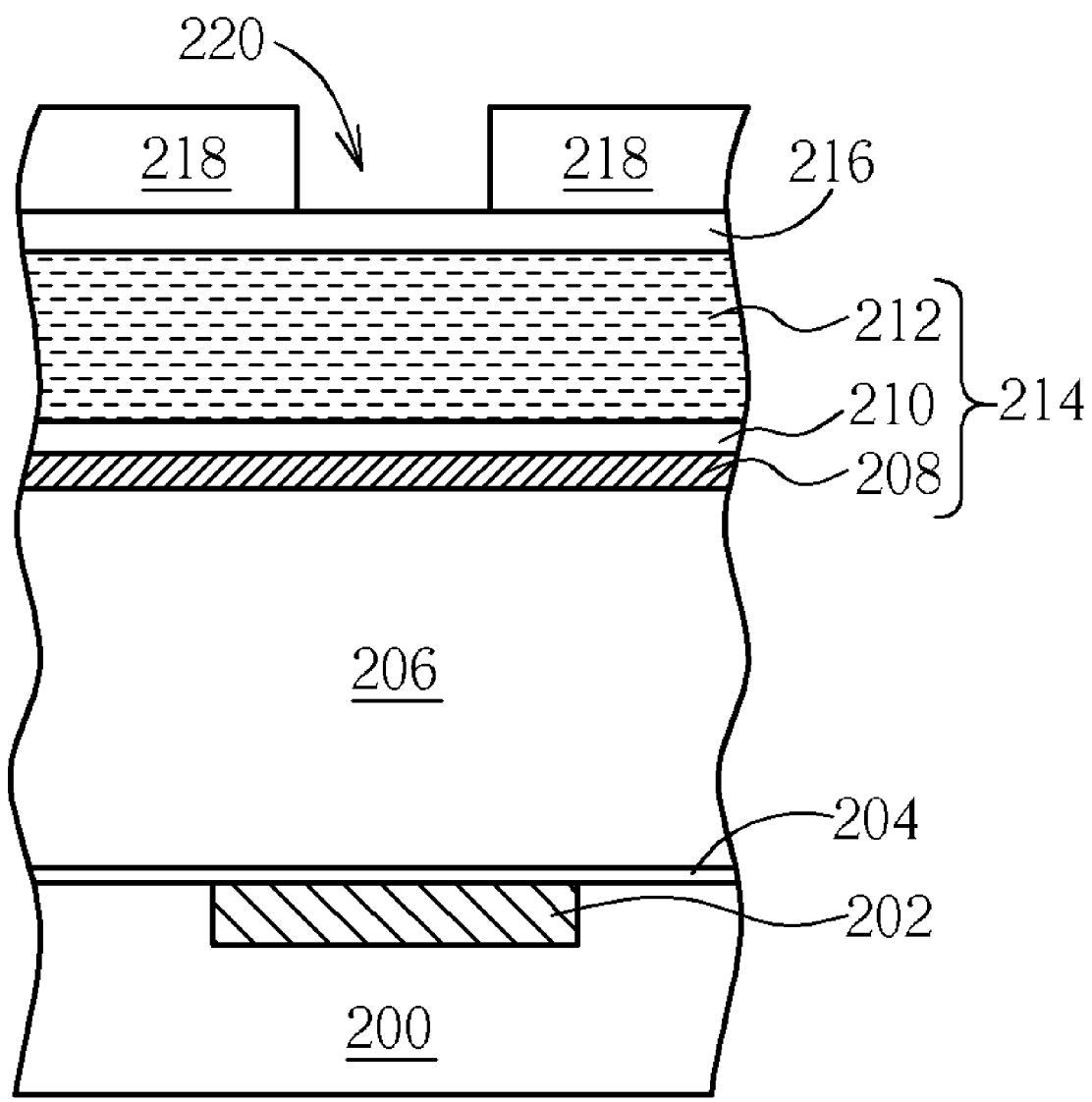
FIG. 8 to FIG. 11 illustrate a second preferred embodiment of the present invention according to the cleaning method as shown in FIG. 1.

Please refer to FIG. 8 to FIG. 11, which illustrate a second preferred embodiment according to the cleaning method as shown in FIG. 1. The cleaning method as shown in FIG. 8 to FIG. 11 is applied in a plug hole fabrication. In which the plug hole may be a contact hole or a via hole. Hereinafter, a cleaning method applied in a contact hole fabrication will be illustrated as an example. As shown in FIG. 8, at first, a semiconductor substrate 200 is provided such as a silicon substrate or a silicon-on-insulator (SOI) substrate, etc. The semiconductor substrate 200 comprises a conductive area 202 such as a conductive dopant or a metal silicide, etc. Then a bottom layer 204, a dielectric layer 206, an etch-stop layer 208, a metal layer 210, a mask layer 212, and a BARC layer 216 are formed in order on the semiconductor substrate 200. Subsequently, a patterned photoresist layer 218 is formed on the BARC layer 216 to define a contact hole pattern 220.

The etch-stop layer 208, the metal layer 210, and the mask layer 212 form a composite layer serving as a hard mask layer 214 during the following etching processes. The etch-stop layer 208 is preferably a silicon carbide (SiC) layer; the metal layer 210 is preferably a titanium nitride (TiN) or a tantalum nitride (TaN) layer; the mask layer 212 is selectively formed with a plasma enhanced oxide (PEOX) layer. In addition, the bottom layer 204 is a silicon nitride layer, and the dielectric layer 206 is made of a low-k dielectric material such as FSG, OSG, or ULK materials.

Figure 9:
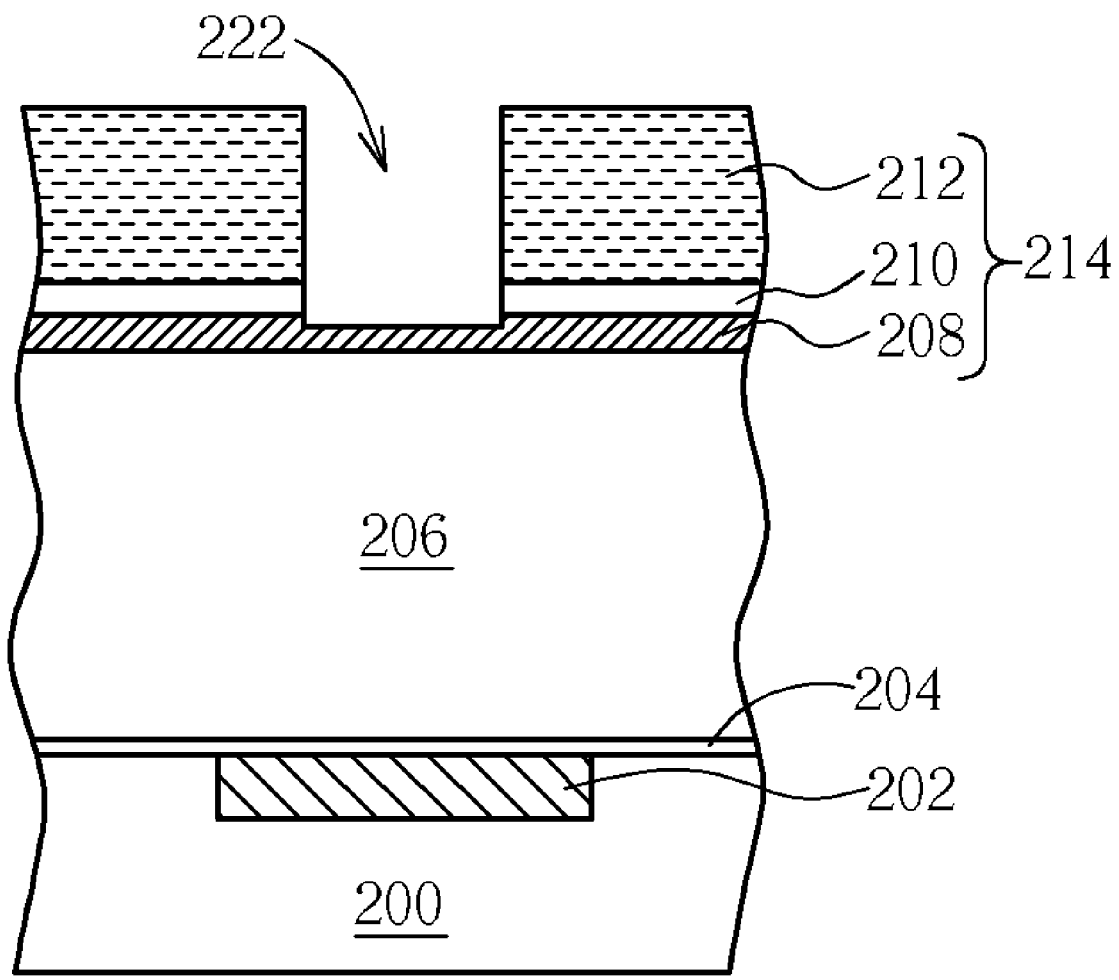

Then, a first etching process is carried out to etch the BARC layer 216, the mask layer 212, the metal layer 210 and a portion of the etch-stop layer 208 through the contact hole pattern 220 within the photoresist layer 218 so as to form a contact hole recess 222 in the hard mask layer 214. The first etching process is stopped at the etch-stop layer 208. Afterwards, the photoresist layer 218 and the BARC layer 216 are removed as shown in FIG. 9.

Figure 10:
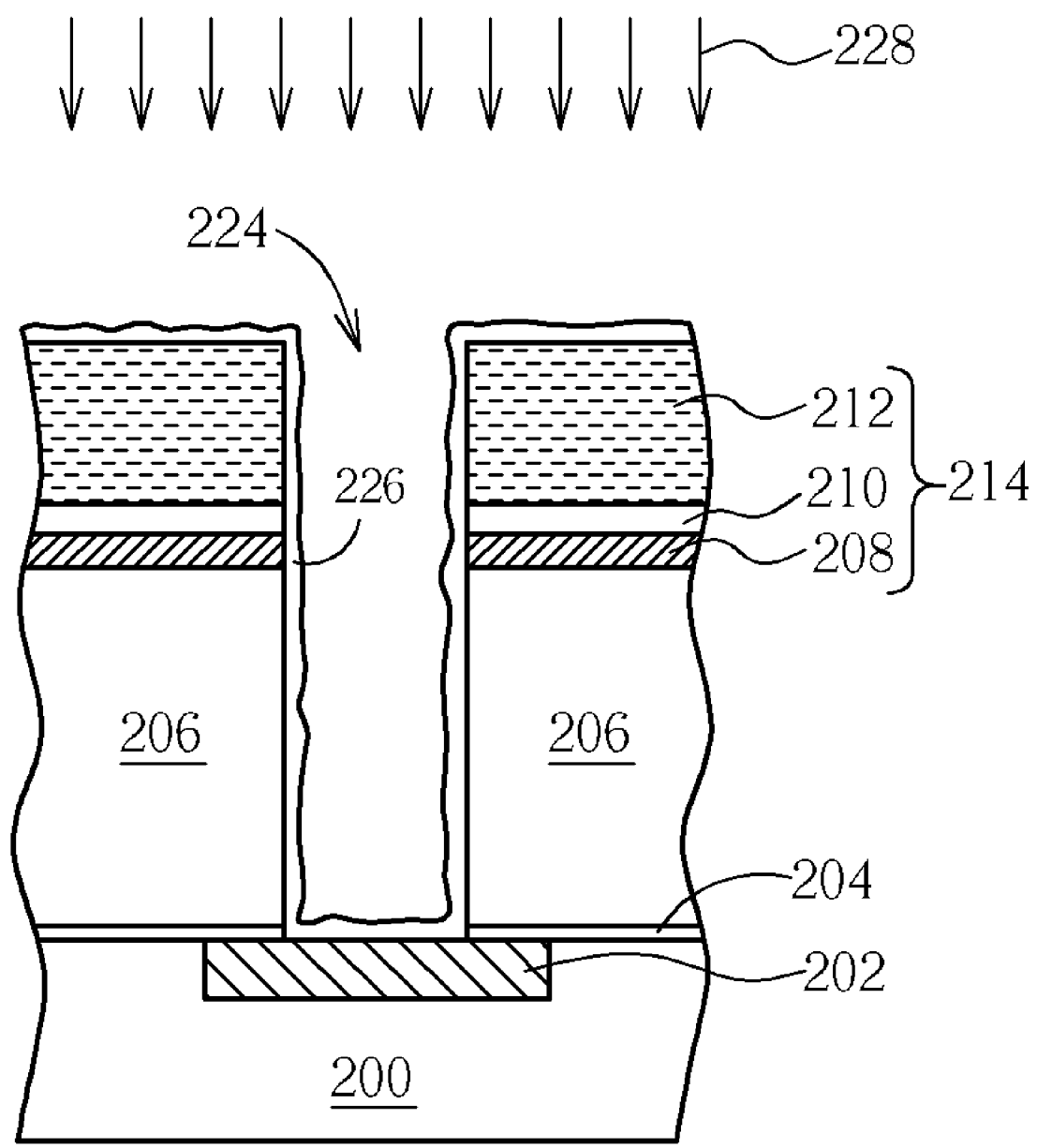

As shown in FIG. 10, a second etching process using the hard mask layer 214 as an etching mask is carried out to etch the dielectric layer 206 through the contact hole recess 222 within the hard mask layer 214 until the conductive area 202 is exposed so as to form a contact hole 224 in the dielectric layer 206.

Since the dielectric layer 206 is made of a low-k material, those etching processes produce polymers having carbon-fluorine bonds remaining in the contact hole 224. On the other hand, hardly-removed metal residues may also be produced remaining in the contact hole 224 while etching the hard mask layer 214 containing the metal layer 212. The polymers having carbon-fluorine bonds and the metal residues are generally called residues 224 herein. Accordingly, an in-situ nitrogen treatment process 228 is performed in the same reaction chamber after performing the second etching process.

According to the preferred embodiment of the present invention, as the opening etch is finished, the nitrogen treatment process 228 is carried out to introduce only nitrogen of a gas flow of about 700 to 1300 standard cubic centimeter per minute (sccm) into the reaction chamber. The pressure of the reaction chamber is set as 150 to 250 mtorr. The power is set as 200 watt (W) generated by a 27 MHz radio frequency generator. The reaction time is about 30 seconds. The nitrogen being introduced into the reaction chamber provides a nitrogen plasma, which comprises nitrogen radicals, nitrogen ions, or nitrogen atoms, to replace a portion of the fluorine atoms in the polymers having carbon-fluorine bonds so as to form volatile products with carbon-nitrogen bonds. Thereafter, the products with carbon-nitrogen bonds can be exhausted out of the reaction chamber by exhaust systems connected to the reaction chamber. In addition, the nitrogen plasma may react with the metal residues to form products that are easily removed. For example, the nitrogen radicals can cleave a portion of the carbon-carbon bonds in the metal residues, which have the carbon-carbon bonds, so as to form products of smaller molecular weights, such as HxCyNz compounds. Therefore, those products of smaller molecular weights can be exhausted out of the reaction chamber by exhaust systems connected to the reaction chamber. Furthermore, those products are also easily removed by the following wet cleaning process.

Figure 11:
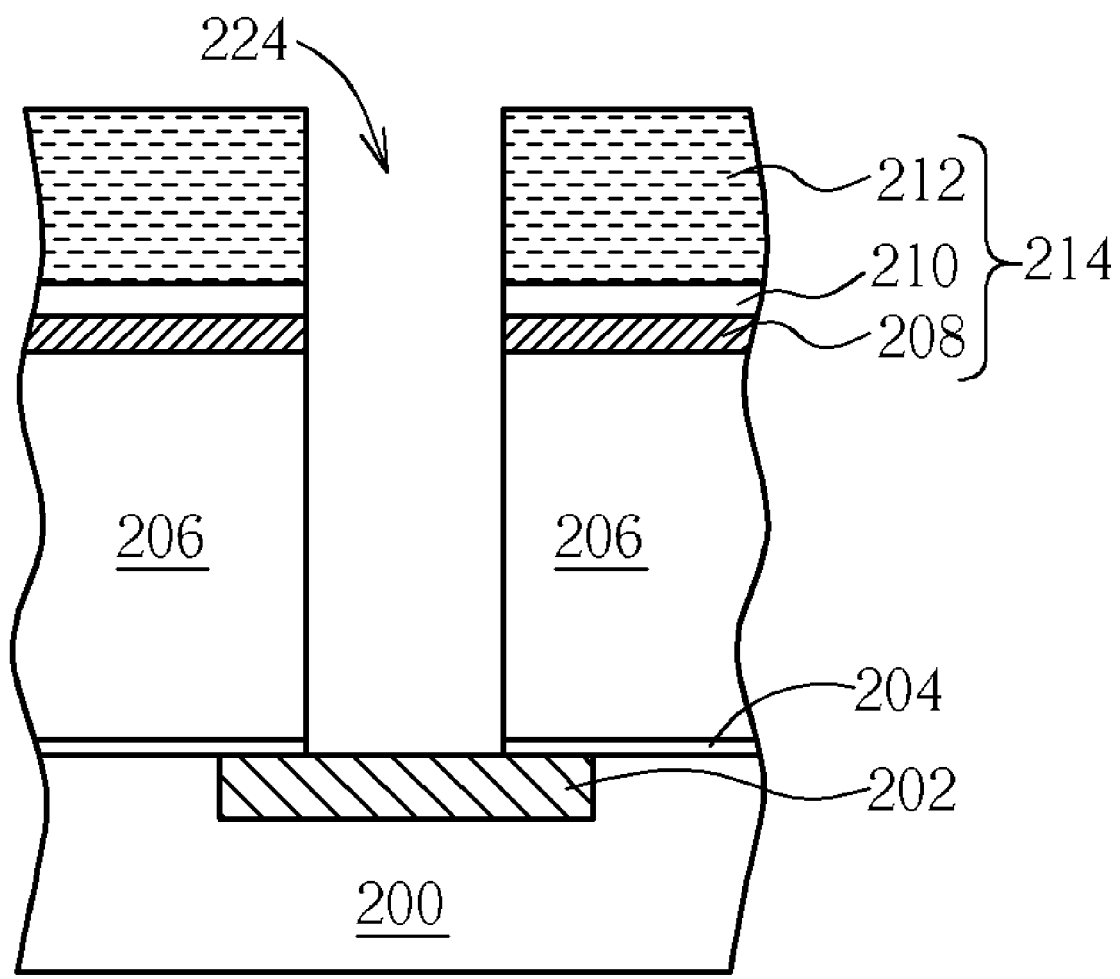

Subsequently, the semiconductor substrate 200 having the contact hole 224 is moved out from the reaction chamber where the etching processes and the nitrogen treatment process 228 are performed. The semiconductor substrate 200 is then moved to a wet cleaning apparatus ready for performing a wet cleaning process. According to the preferred embodiment of the present invention, the wet cleaning process is carried out to dip the semiconductor substrate 200 having the contact hole 224 in a diluted hydrofluoric acid of a concentration of about 2.5 ppm for about 1 to 5 minutes. Finally, as shown in FIG. 11, a clean contact hole 224 is obtained. Afterward, deposition processes and polishing processes and so on are performed to from a contact plug in the contact hole 224. This process is well known by those skilled in the art and the details of which are not further explained herein for the sake of brevity.

The present invention utilizes only an in-situ nitrogen treatment process and a wet cleaning process to achieve a high cleaning efficiency in removing the residues result from an opening etch of an interconnection fabrication; therefore, the fabrication processes can be simplified greatly so as to increase the throughput and to lower the fabrication cost. In addition, the yield can be improved substantially along with the increase of the cleaning capacity. Furthermore, because the present invention only utilizes nitrogen as a plasma source instead of using reactive gas such as hydrogen ($H_2$), oxygen ($O_2$), or carbon tetrafluoride (CF4), etc, as a plasma source; therefore, the problems relating to damaging low-k dielectric layers and changing the k value of the low-k dielectric layers in the prior art can be avoided. It should be noticed that the cleaning gas used in the present invention is not limited to nitrogen gas, other non-reactive gases such as noble gases i.e., helium, or neon, etc may also be used.

Those skilled in the art will readily observe that numerous modifications and alterations of the device and method may be made while retaining the teachings of the invention.

What is claimed is:

1. A cleaning method following an opening etch, comprising:
   providing a substrate having a dielectric layer formed with a low-k material;
   performing the opening etch to form at least an opening in the dielectric layer;
   performing a nitrogen treatment process to clean polymer residues having carbon-fluorine (C—F) bonds remained and disposed at two sidewalls and the bottom of the opening by using only nitrogen gas or a noble gas; and
   performing a wet cleaning process.

2. The method of claim 1, further comprises forming a hard mask layer on the dielectric layer after forming the dielectric layer, and the dielectric layer comprises at least a metal layer.

3. The method of claim 2, wherein the hard mask layer is a composite layer, which comprises a silicon carbide (SiC) layer, the metal layer, and a plasma enhanced oxide (PEOX) layer from bottom to top.

4. The method of claim 2, wherein the metal layer comprises titanium nitride (TiN) or tantalum nitride (TaN).

5. The method of claim 2, metal residues having carbon-carbon (C—C) bonds are formed remaining in the opening during the opening etch.

6. The method of claim 5, wherein the nitrogen treatment process provides a nitrogen plasma, which comprises nitrogen radicals, nitrogen ions, and nitrogen atoms, to reactive with the metal residues having carbon-carbon (C—C) bonds, so as to form HxCyNz compounds.

7. The method of claim 1, wherein the nitrogen treatment process and the opening etch are performed in a same reaction chamber continuously.

8. The method of claim 1, wherein nitrogen is used as a cleaning gas in the nitrogen treatment process.

9. The method of claim 8, wherein the nitrogen treatment process provides a nitrogen plasma, which comprises nitrogen radicals, nitrogen ions, and nitrogen atoms, to replace a portion of the fluorine atoms in the polymer residues having carbon-fluorine (C—F) bonds to form volatile products having carbon-nitrogen (C—N) bonds.

10. The method of claim 9, wherein the nitrogen treatment process has a gas flow of about 700 to 1300 standard cubic centimeters per minute (sccm); a chamber pressure of about 150 to 250 mtorr; a power of 200 watt (W) generated by a 27 megahertz (MHZ) radio frequency generator; and a reaction time of about 30 seconds.

11. The method of claim 1, wherein the noble gas comprises at least one of Helium or Neon.

12. The method of claim 1, wherein the wet cleaning process comprises dipping the semiconductor substrate comprising the opening in a diluted hydrofluoric acid solution with a concentration of about 2.5 parts per million (ppm) for about 1 to 5 minutes.

13. The method of claim 1, wherein the opening is a dual damascene opening.

14. The method of claim 13, wherein the semiconductor substrate further comprising:
   a bottom dielectric layer disposed between the semiconductor substrate and the dielectric layer;
   a conductive layer positioned within the bottom dielectric layer;
   a first bottom anti-reflection coating (BARC) disposed on the hard mask layer; and
   a first photoresist layer having a trench pattern exposing a portion of the first BARC disposed on the first BARC.

15. The method of claim 14, wherein the method of forming the opening further comprising:
   performing a first etching process to etch the first BARC and the hard mask layer through the trench pattern to form a trench recess within the hard mask layer;
   removing the first photoresist layer and the first BARC;
   forming a second BARC and a second photoresist layer, wherein the second BARC fills the trench recess and the second photoresist layer comprises a via pattern exposing a portion of the second BARC;
   performing a second etching process to etch the second BARC, the hard mask layer and a portion of the dielectric layer through the via pattern to form a via recess in the dielectric layer;
   removing the second photoresist layer and the second BARC; and
   performing a third etching process to etch the dielectric layer through the via recess and the trench recess until the conductive layer is exposed.

16. The method of claim 1, wherein the opening is a plug hole.

* * * * *